(12) United States Patent
Matsunaga (10) Patent No.: US 7,866,999 B2
(45) Date of Patent: Jan. 11, 2011

(54) CONNECTOR HAVING AN EJECTION MECHANISM OPERABLE TO EJECT A CARD

(75) Inventor: Akihiro Matsunaga, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/590,169

(22) Filed: Nov. 3, 2009

(65) Prior Publication Data

US 2010/0130040 A1    May 27, 2010

(30) Foreign Application Priority Data

Nov. 26, 2008    (JP) ............................ 2008-301365

(51) Int. Cl.
*H01R 13/62* (2006.01)
(52) U.S. Cl. ..................................... 439/159; 439/630
(58) Field of Classification Search ................ 439/159, 439/160, 630, 946
See application file for complete search history.

(56) References Cited

U.S. PATENT DOCUMENTS

| | | | |
|---|---|---|---|
| 7,309,245 B2 | 12/2007 | Sadatoku | |
| 7,361,035 B1 * | 4/2008 | Lai | 439/155 |
| 7,367,824 B1 * | 5/2008 | Yen et al. | 439/152 |
| 7,381,069 B2 * | 6/2008 | Saito et al. | 439/159 |
| 7,461,792 B2 * | 12/2008 | Lin | 235/492 |
| 7,484,976 B2 * | 2/2009 | Ezaki | 439/159 |
| 7,637,759 B2 * | 12/2009 | Kobayashi et al. | 439/159 |
| 7,651,351 B2 * | 1/2010 | Yen et al. | 439/159 |
| 2003/0194897 A1 | 10/2003 | Nishioka | |

FOREIGN PATENT DOCUMENTS

| | | |
|---|---|---|
| JP | 2003-308910 | 10/2003 |
| JP | 2007-200815 | 8/2007 |

OTHER PUBLICATIONS

Japanese Office Action dated Oct. 7, 2010 with English translation of same.

* cited by examiner

*Primary Examiner*—Thanh-Tam T Le
(74) *Attorney, Agent, or Firm*—Collard & Roe, P.C.

(57) ABSTRACT

A connector has an ejection mechanism operable to eject a card having a notch along a length direction, at least one contact, a housing for holding the at least one contact, and a cover for covering the housing. The ejection mechanism includes a movable unit that is movable between a holding position, at which the movable unit is located when the card has been inserted in the connector, and an ejecting position, at which the movable unit is located when the card has been ejected from the connector, along the length direction during insertion and ejection of the card. The movable unit includes a lock portion movable along a width direction perpendicular to the length direction as well as along the length direction when the movable unit moves along the length direction. The lock portion is located within the notch of the card to prevent ejection of the card when the movable unit is located at the holding position. The cover and the housing define a cavity that can receive at least part of the card and an opening for allowing the card to be inserted into the cavity. The connector also has a width-direction movement regulator configured to prevent the lock portion from moving in the width direction when the movable unit is located at the holding position.

8 Claims, 14 Drawing Sheets

CONNECTOR HAVING AN EJECTION MECHANISM OPERABLE TO EJECT A CARD

CROSS REFERENCE TO RELATED APPLICATIONS

Applicant claims priority under 35 U.S.C. §119 of Japanese Patent Application No. JP2008-301365 filed on Nov. 26, 2008.

BACKGROUND OF THE INVENTION

The present invention relates to a connector connectable to a card. More particularly, the present invention relates to a connector for a memory card of a cellular phone or the like.

For example, this type of connector is disclosed in JP-A 2007-200815, the contents of which are incorporated herein by reference. The connector disclosed in JP-A 2007-200815 has a lock member for preventing improper ejection of a card in a state where the card is connected to the connector. Specifically, the card includes a notch formed therein. Improper ejection of the card is prevented because a lock portion of the lock member is located within the notch of the card when part of the card is received in the connector.

In order to enhance the reliability of locking in the connector disclosed in JP-A 2007-200815, the thickness of the lock member should be increased so as to enhance the strength thereof. At that time, the length of the lock member should be increased in view of the spring characteristics or the like so that the lock member becomes larger in size. The large-sized lock member results in problematically increasing the size of the connector.

SUMMARY OF THE INVENTION

It is therefore an object of the present invention to provide a connector having high reliability of locking without increasing the size of the connector.

One aspect of the present invention provides a connector having an ejection mechanism operable to eject a card having a notch along a length direction, at least one contact, a housing for holding the at least one contact, and a cover for covering the housing. The ejection mechanism includes a movable unit that is movable between a holding position, at which the movable unit is located when the card has been inserted in the connector, and an ejecting position, at which the movable unit is located when the card has been ejected from the connector, along the length direction during insertion and ejection of the card. The movable unit includes a lock portion movable along a width direction perpendicular to the length direction as well as along the length direction when the movable unit moves along the length direction. The lock portion is located within the notch of the card to prevent ejection of the card when the movable unit is located at the holding position. The cover and the housing define a cavity that can receive at least part of the card and an opening for allowing the card to be inserted into the cavity. The connector also has a width-direction movement regulator configured to prevent the lock portion from moving in the width direction when the movable unit is located at the holding position.

An appreciation of the objectives of the present invention and a more complete understanding of its structure may be had by studying the following description of the preferred embodiment and by referring to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 9:
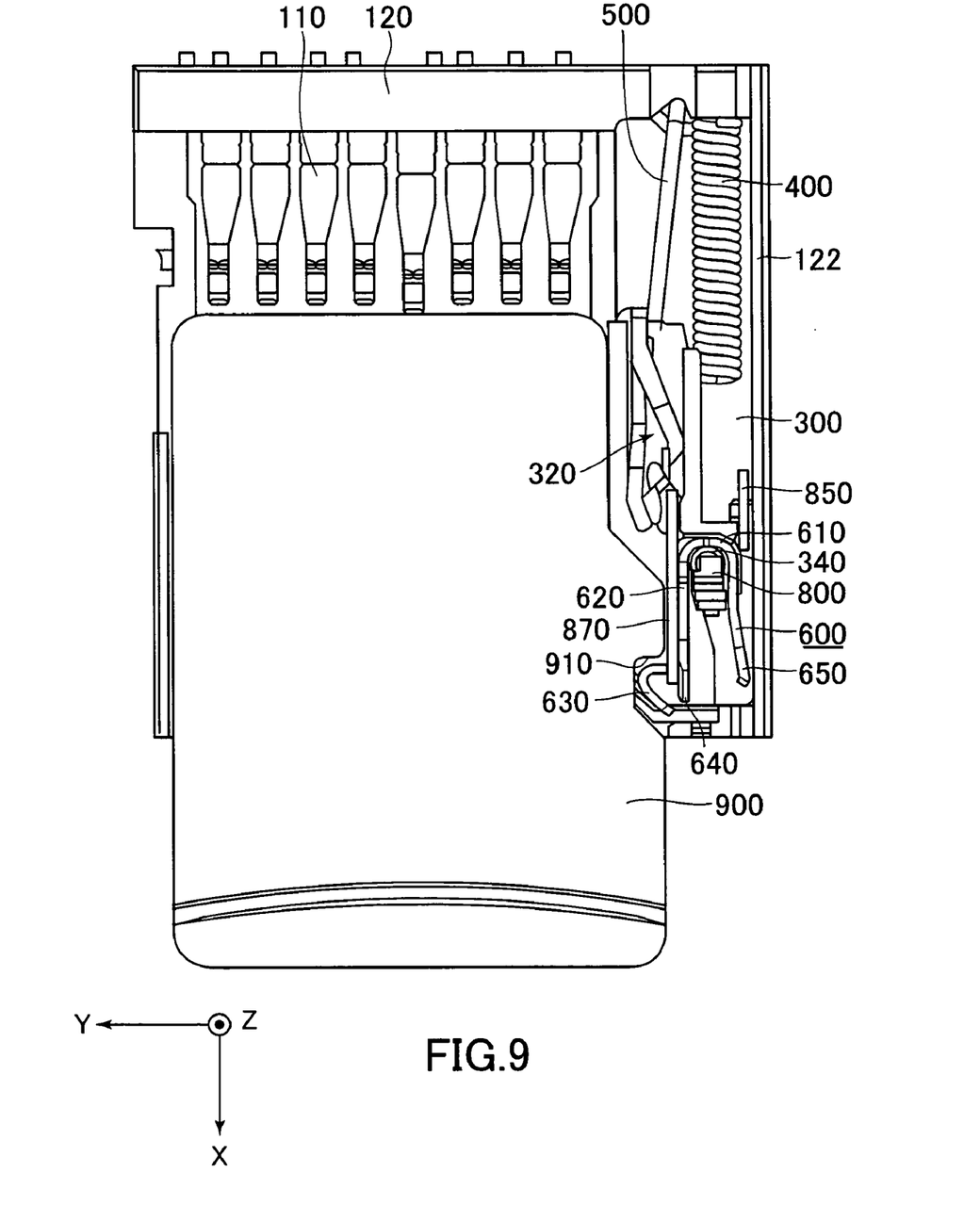
FIG. 9 is a plan view showing the connector in an ejecting state, in which only part of the cover is illustrated.

Referring to FIGS. 1 to 4, a connector 100 according to an embodiment of the present invention includes a plurality of contacts 110, a housing 120 formed of an insulating material so as to hold the contacts 110, a metal cover 130 covering the housing 120, and an ejection mechanism 140 operable to eject a card 900 along the X-direction (length direction). As shown in FIG. 9, the card 900 has a notch 910 formed therein. Hereinafter, the X-direction, the Y-direction, and the Z-direction are referred to as the length direction, the width direction, and the thickness direction, respectively. However, these terms never limit the size or shape of the card 900 and the connector 100.

The housing 120 and the cover 130 jointly define a cavity 200 that can receive part of the card 900 and an opening 250 that allows the card 900 to be inserted into the cavity 200. The cover 130 of the present embodiment has a follower pusher 132, a stopper 800, a reaction amplifier 850, and a lock portion positioner 870, each of which will be described later.

Figure 1:
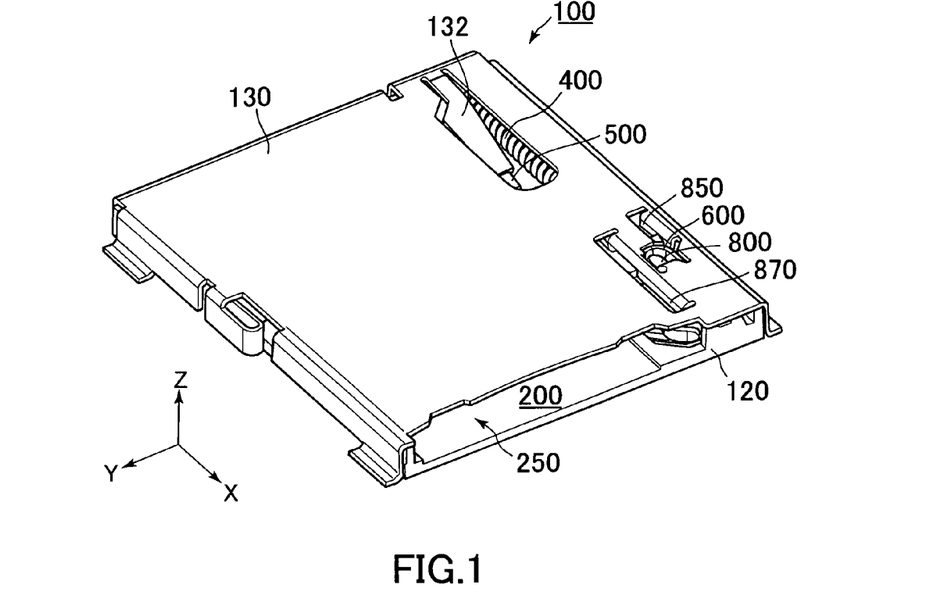
FIG. 1 is a perspective view showing a connector according to an embodiment of the present invention.
Figure 2:
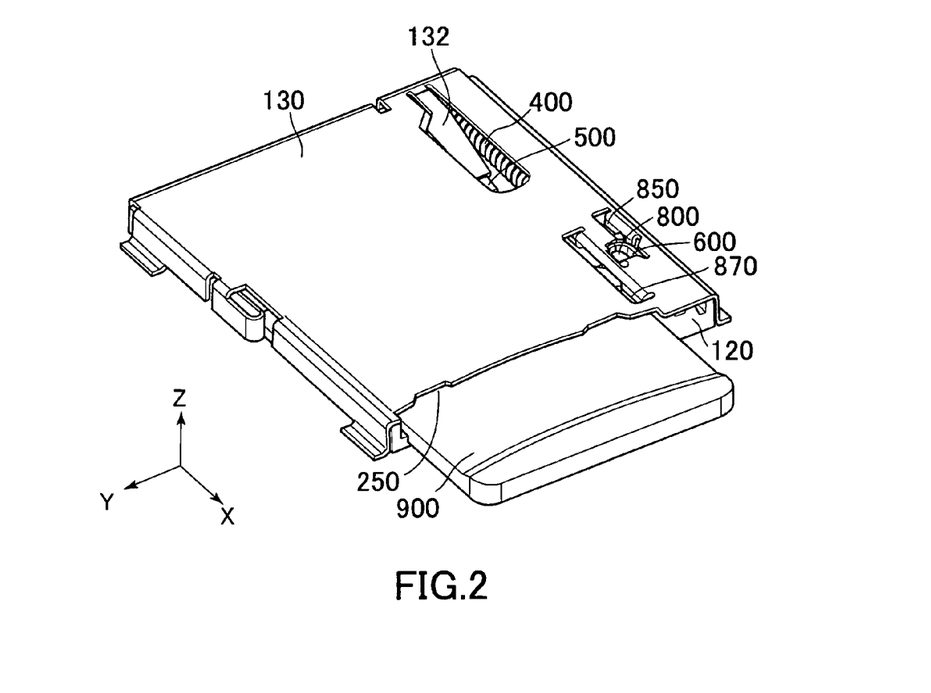
FIG. 2 is a perspective view showing an initial stage of insertion of a card into the connector of FIG. 1.
Figure 3:
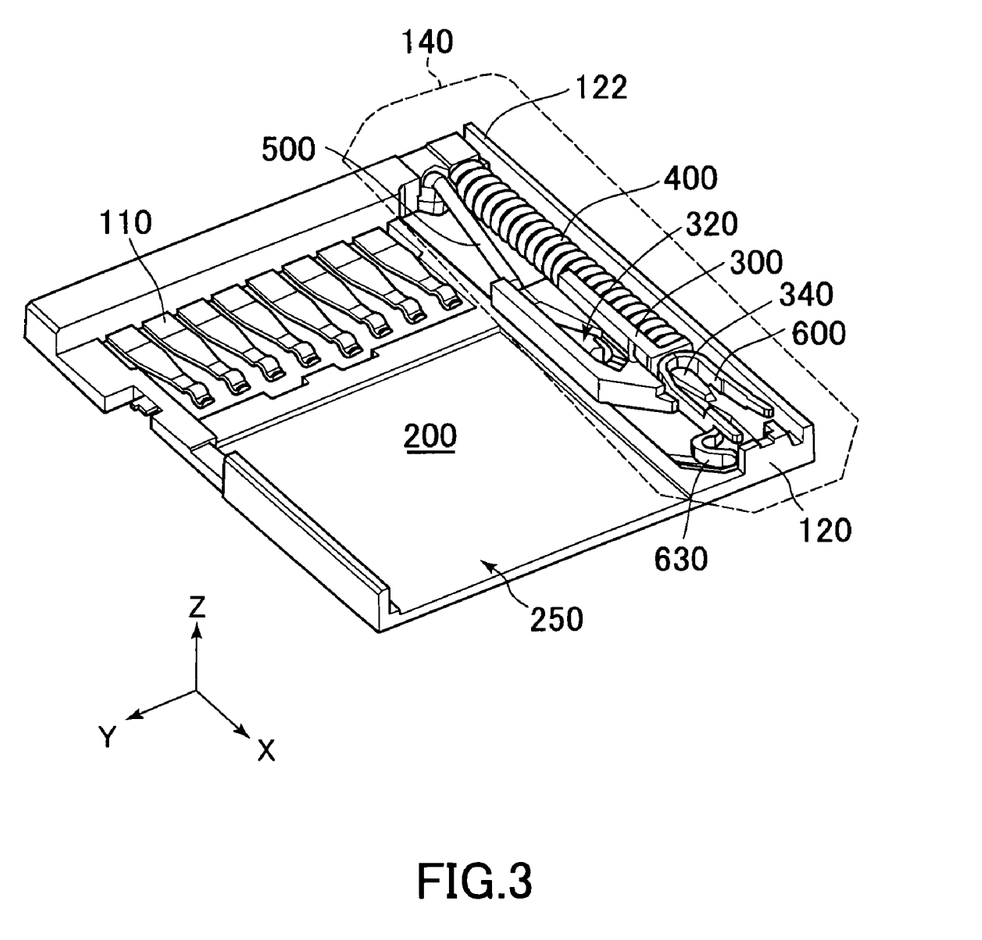
FIG. 3 is a perspective view showing the connector of FIG. 1 without a cover.
Figure 4:
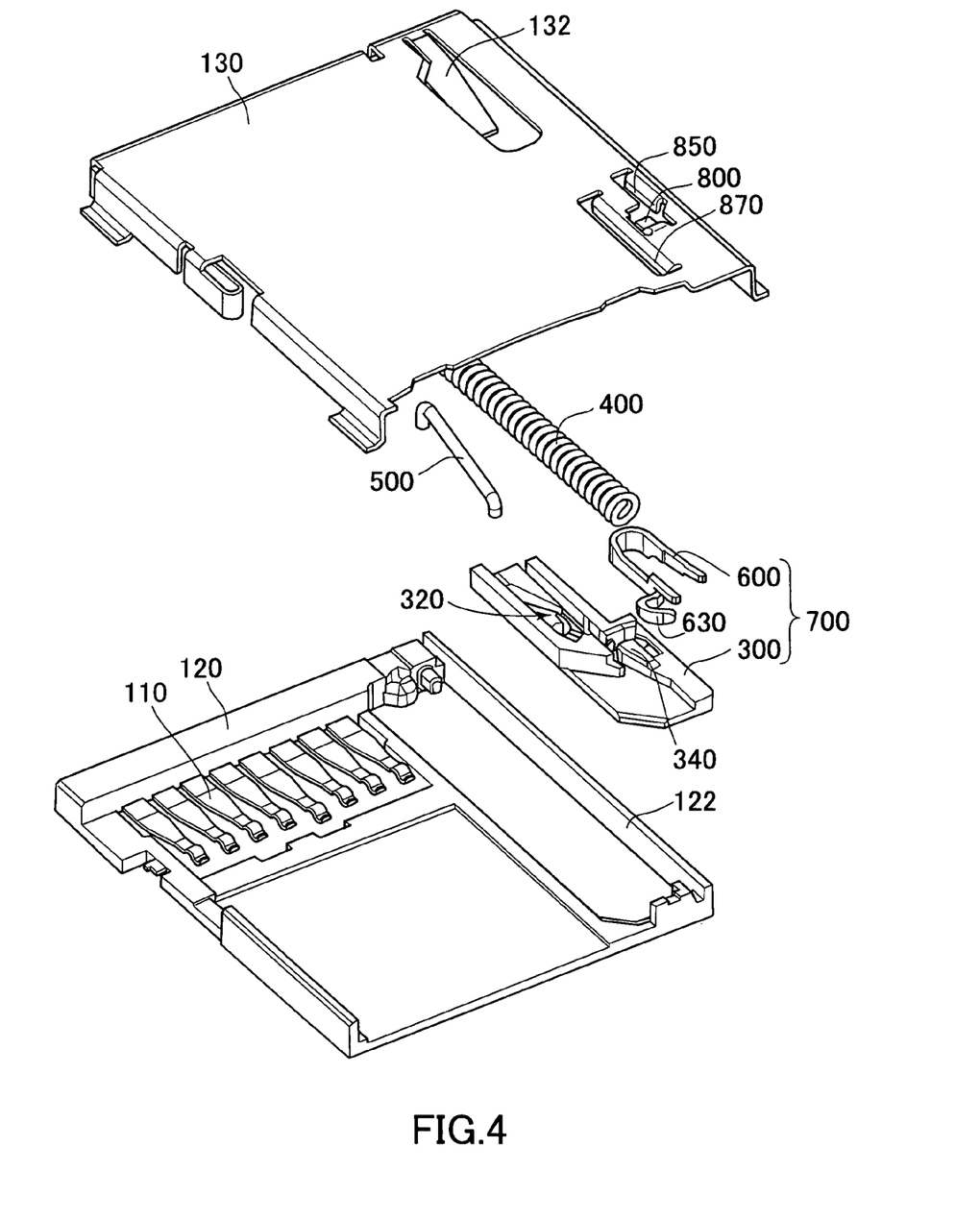
FIG. 4 is an exploded perspective view showing the connector of FIG. 1.

As shown in FIGS. 3 and 4, the ejection mechanism 140 of the present embodiment includes an ejection bar 300 of an insulating material, a coil spring 400, a cam follower 500, and a lock member 600.

The ejection bar 300 includes a heart cam 320 and a holder 340 for holding the lock member 600. The ejection bar 300 is incorporated in the housing 120 so that the ejection bar 300 is slidable between a holding position and an ejecting position according to movement of the card 900 along the X-direction. Here, the holding position is a position of the ejection bar 300 (movable unit 700) when the card 900 has been connected to the connector 100. The ejecting position is a position of the ejection bar 300 (movable unit 700) when the card 900 has been ejected from the connector 100. That is, the holding position is located farther away from the opening 250 than the ejecting position. The ejection bar 300 is continuously biased toward the ejecting position by the coil spring 400.

The cam follower 500 has an end inserted in the heart cam 320. Specifically, the cam follower 500 of the present embodiment is a metal rod having a roughly hook-shape. The cam follower 500 has another end pivotably supported on the housing 120. The ejection bar 300 receives a force applied along an insertion direction (length direction) by the card 900 at the time of insertion of the card 900 and receives a force applied along an ejection direction (length direction) at the time of ejection of the card 900. Therefore, the end of the cam follower 500 is basically pressed against a cam surface of the heart cam 320 at all times. Thus, the cam follower 500 follows the cam surface of the heart cam 320 according to movement of the ejection bar 300. The follower pusher 132 formed on the cover 130 serves to continuously bias the cam follower 500 toward the heart cam 320 so as to ensure that the cam follower 500 follows the heart cam 320 (see FIGS. 1 and 2).

As shown in FIG. 3, the holder 340 of the present embodiment holds the lock member 600 with a play. Therefore, the lock member 600 can move to some extent in a state in which it is held by the holder 340. The holder 340 of the present embodiment has an end near the opening 250 that has a surface extending in a direction that is oblique to both of the X-direction and the Z-direction (thickness direction). Specifically, the end of the holder 340 near the opening 250 is configured such that its height is gradually increased toward the far side of the connector as viewed from the opening 250.

As described above, the ejection bar 300 and the lock member 600 held by the ejection bar 300 move along the X-direction. However, the coil spring 400 and the cam follower 500 do not move along the X-direction while they expand and contract or rotate. Specifically, in the present embodiment, only the ejection bar 300 and the lock member 600 form a movable unit 700 movable along the X-direction (see FIG. 4).

Figure 6:
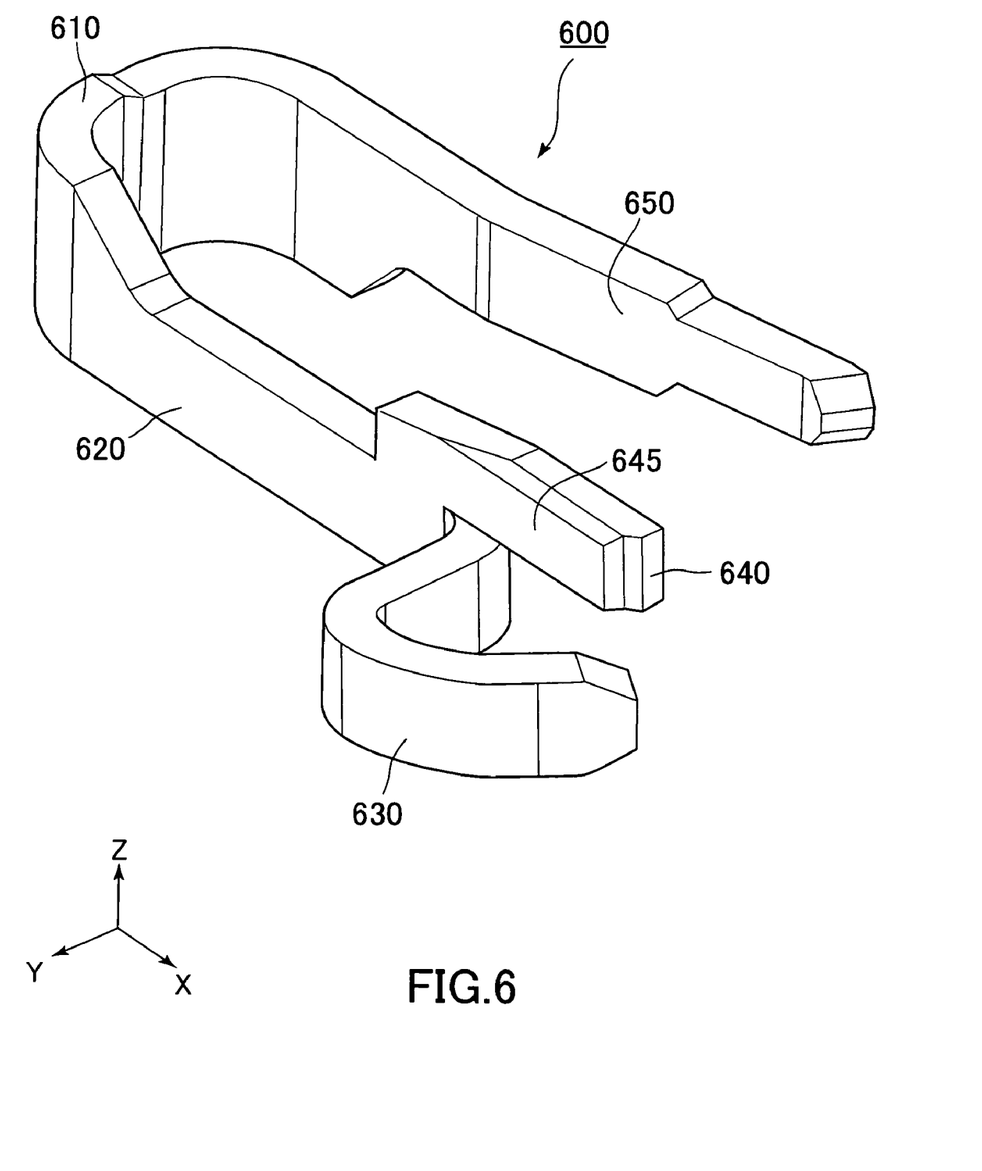
FIG. 6 is a perspective view showing a lock member included in the connector of FIG. 1.

As shown in FIGS. 3 and 6, the lock member 600 includes a base 610, a primary spring portion 620 extending from the base 610, a lock portion 630 extending along the Y-direction (width direction) from an end of the primary spring portion 620 into the cavity 200, an abutment portion 640 extending along the X-direction from the end of the primary spring portion 620, and an auxiliary spring portion 650 extending from the base 610 so as to form a roughly U-shape together with the base 610 and the primary spring portion 620. The base 610 is held by the holder 340 of the ejection bar 300. The primary spring portion 620 supports the lock portion 630 in an elastic manner such that the lock portion 630 can move in the Y-direction. The lock portion 630 is located within the notch 910 of the card 900 when the ejection bar 300 is located at the holding position. Thus, the lock portion 630 serves to prevent ejection of the card 900 (see FIG. 7). The abutment portion 640 of the present embodiment is provided near the lock portion 630. The abutment portion 640 and the lock portion 630 of the present embodiment form a bifurcate shape as viewed along the Z-direction. Furthermore, the abutment portion 640 of the present embodiment is located at a different position than the lock portion 630 in the Z-direction. With such an arrangement, the size of the lock member 600 can be reduced in the X-direction. The abutment portion 640 has a surface facing the cavity 200, which serves as a Y-direction abutment portion (width-direction abutment portion) 645 as described later. The auxiliary spring portion 650 abuts a predetermined internal portion of the connector 100, receives a reaction force from the predetermined internal portion, and biases the lock portion 630 toward the inner side of the cavity 200 with the reaction force. In order to attain the biasing effect of the auxiliary spring portion 650 to the lock portion 630, the holder 340 of the present embodiment holds the base 610 with a play as described above.

As described above, the cover 130 of the present embodiment includes the reaction amplifier 850 and the lock portion positioner 870.

As shown in FIGS. 1, 2, 4, and 5, the reaction amplifier 850 of the present embodiment is formed of a small piece produced by making a hook-shaped incision in part of the cover 130 and then bending the incised portion toward the housing 120. The reaction amplifier 850 abuts the auxiliary spring portion 650 in the Y-direction when the ejection bar 300 is located at the holding position. However, the reaction amplifier 850 does not abut the auxiliary spring portion 650 when the ejection bar 300 is located at the ejecting position. The auxiliary spring portion 650 abuts a sidewall 122 of the housing 120 when the ejection bar 300 is located at the ejecting position. Specifically, the auxiliary spring portion 650 of the present embodiment abuts the sidewall 122 of the housing 120 most of time. Only when the ejection bar 300 is located at the holding position, the auxiliary spring portion 650 abuts the reaction amplifier 850 and receives a greater reaction force. Nevertheless, the present invention is not limited to this example. For example, the reaction amplifier 850 may be arranged to have a length in the X-direction such that it abuts the auxiliary spring portion 650 when the ejection bar 300 is located at the ejecting position. In such a case, the connector is increased in size. Therefore, it is preferable to provide the reaction amplifier 850 at a minimum area as described above.

Specifically, the reaction amplifier 850 is arranged such that the auxiliary spring portion 650 is located between the lock portion 630 and the reaction amplifier 850 in the Y-direction with abutting the reaction amplifier 850 in the Y-direction when the ejection bar 300 is located at the holding position. With this arrangement, when the ejection bar 300 is located at the holding position, the auxiliary spring portion 650 receives a greater reaction force as compared to a case where there is no reaction amplifier 850. This great reaction force ensures that the lock portion 630 of the present embodiment is biased toward the inner side of the cavity 200.

Figure 10:
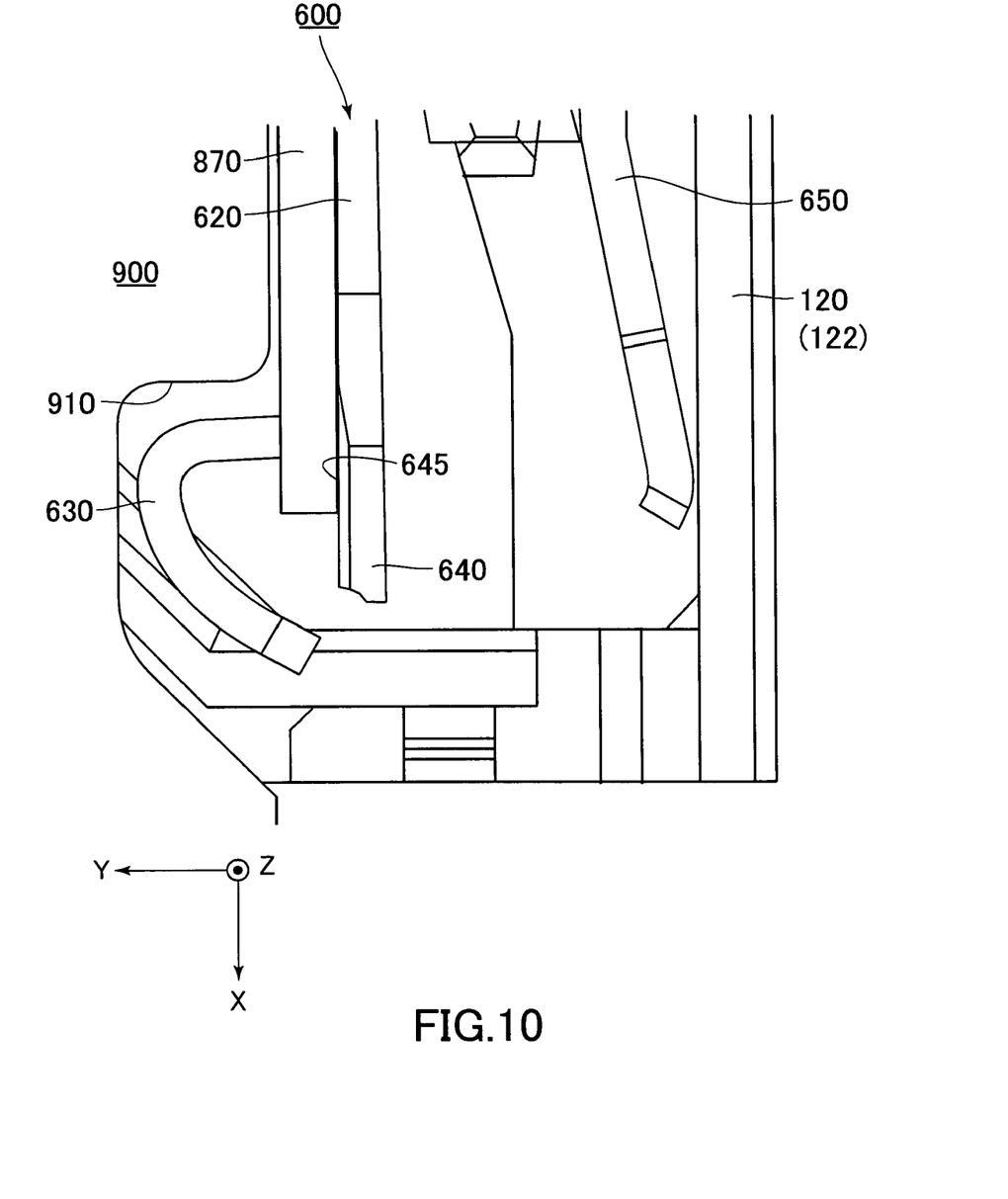
FIG. 10 is an enlarged plan view showing the lock portion and its vicinity in the connector of FIG. 9.
Figure 11:
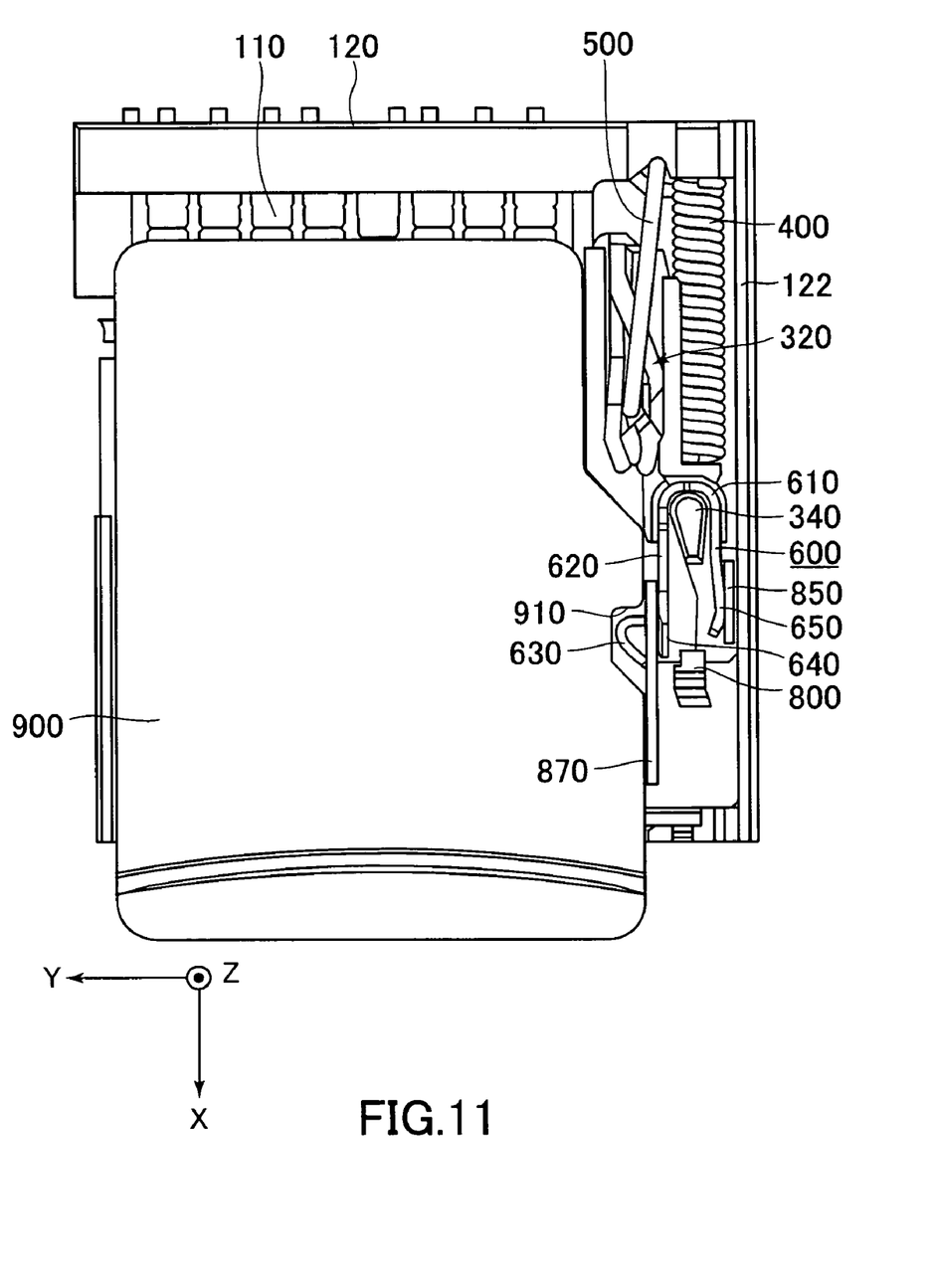
FIG. 11 is a plan view showing the connector in the holding state, in which only part of the cover is illustrated.
Figure 12:
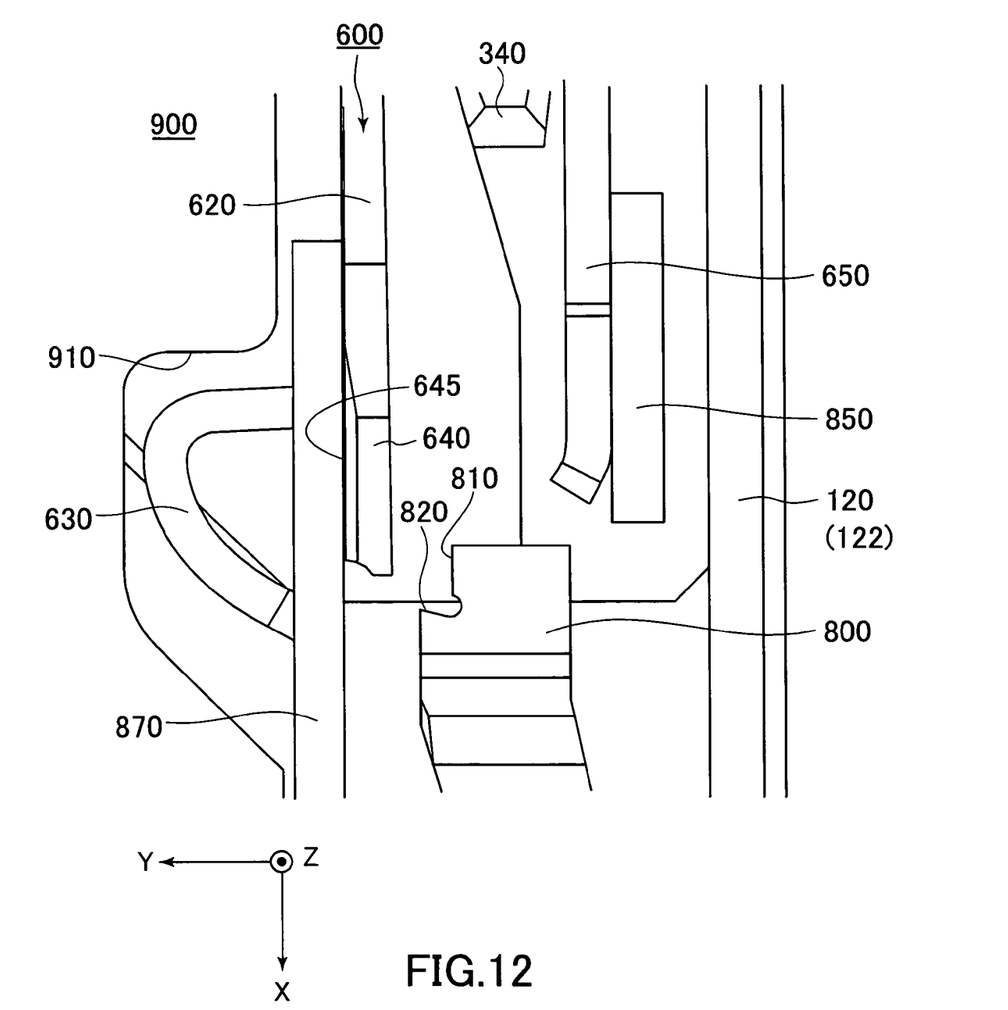
FIG. 12 is an enlarged plan view showing the lock portion and its vicinity in the connector of FIG. 11.

However, it is unfavorable to press the lock portion 630 against the card 900 with a large force when the card 900 has been connected to the connector 100. Therefore, it is preferable to ensure that the lock portion 630 biased by the auxiliary spring portion 650 is located within the notch 910 of the card 900 and to position the lock portion 630 at such a location that strong contact of the lock member 600 (lock portion 630) with the card 900 can be avoided. In the present embodiment, the positioning of the lock portion 630 is achieved by bringing the Y-direction abutment portion 645 into abutment with the lock portion positioner 870. The lock portion positioner 870 of the present embodiment is formed of a small piece produced by making a hook-shaped incision in part of the cover 130 and then bending the incised portion toward the housing 120. In order to position the lock portion 630 as described above, the lock portion positioner 870 should be located closer to the cavity 200 than the Y-direction abutment portion 645 as shown in FIGS. 11 and 12 at least when the ejection bar 300 is located at the holding position. The lock portion positioner 870 of the present embodiment is arranged so as to be closer to the cavity 200 than the Y-direction abutment portion 645 as shown in FIGS. 9 and 10 when the ejection bar is located at the ejecting position.

The reaction amplifier 850 and/or the lock portion positioner 870 may be provided on the housing 120 rather than the cover 130 or may be provided at a member that is separated from the cover 130 and the housing 120 and is attached to the cover 130 or the housing 120.

Figure 5:
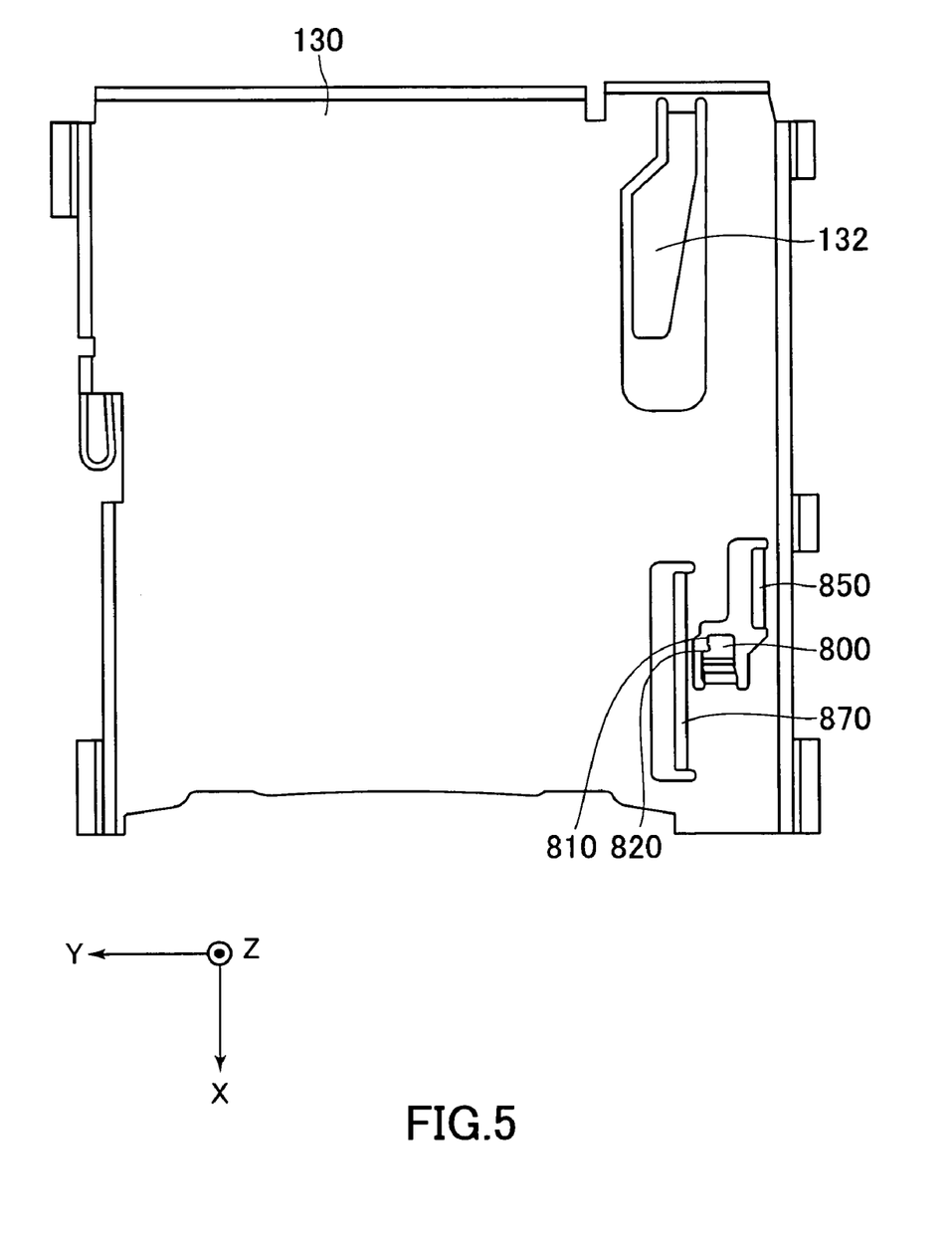
FIG. 5 is a plan view showing a cover included in the connector of FIG. 1.
Figure 7:
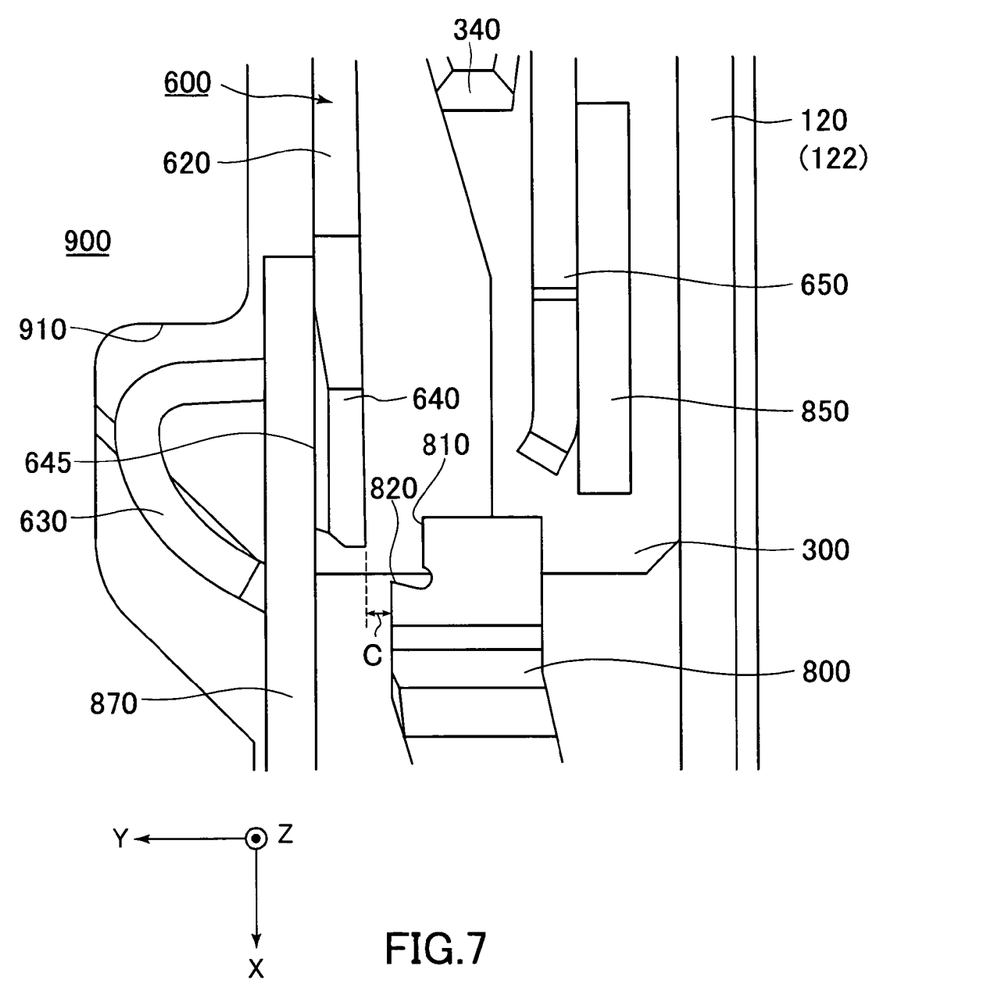
FIG. 7 is an enlarged plan view showing a lock portion of the lock member and its vicinity in a holding state.
Figure 8:
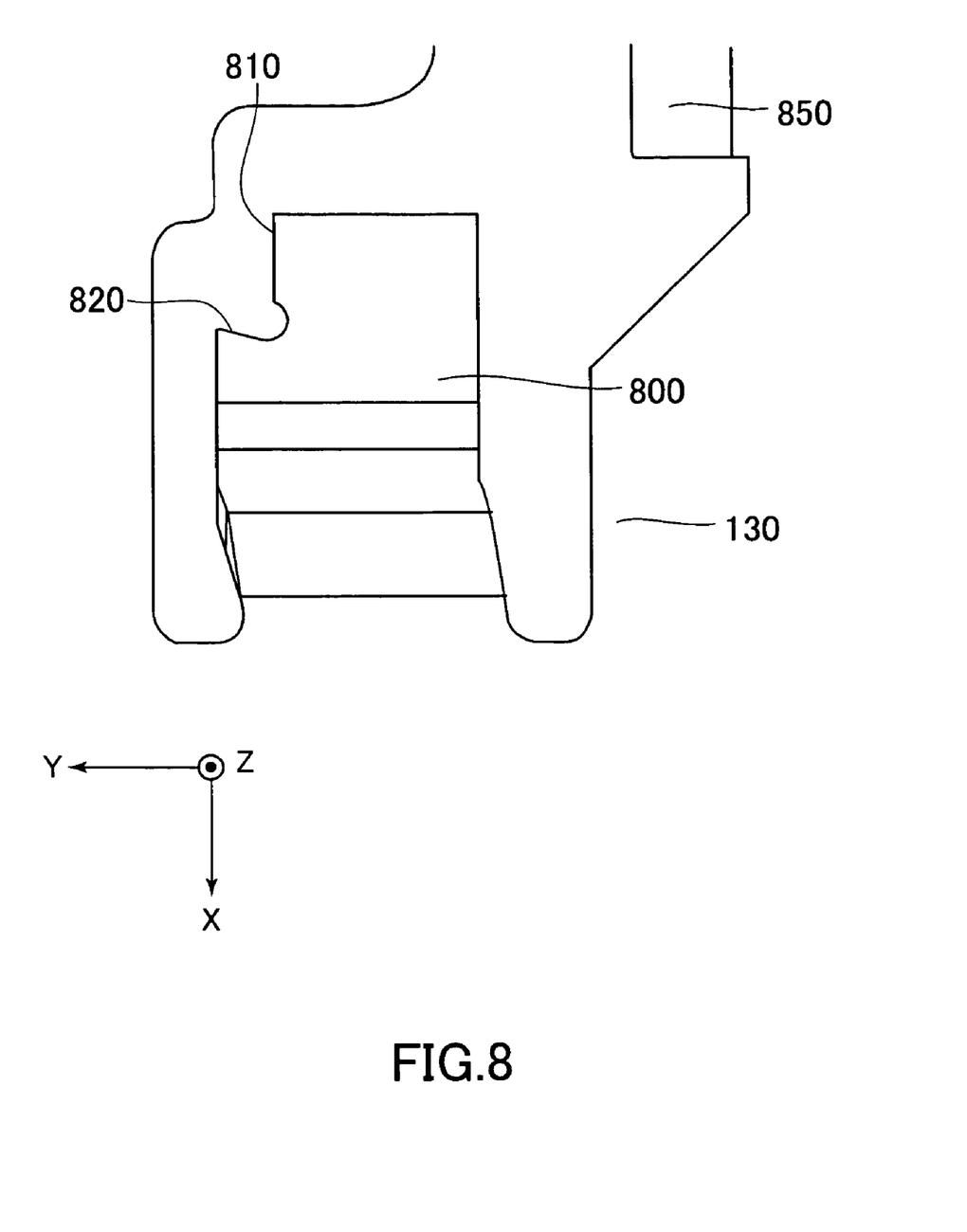
FIG. 8 is a plan view showing part of the cover included in the connector of FIG. 1.

As described above, the stopper 800 is also formed on the cover 130 of the present embodiment. As shown in FIGS. 5, 7, and 8, the stopper 800 extends along the insertion direction (length direction) so as to descend from the primary surface of the cover 130 (toward the housing 120). A tip of the stopper 800 has a roughly L-shaped notch formed near the cavity 200 as viewed along the Z-direction. The roughly L-shaped notch has an edge extending along the X-direction, which forms a Y-direction movement regulator (width-direction movement regulator) 810 for regulating movement of the lock portion 630 in the negative Y-direction (width direction) that exceeds a predetermined amount by stopping the abutment portion 640 in the Y-direction when the abutment portion 640 is to move in the negative Y-direction in a state in which the ejection bar 300 is located at the holding position. The roughly L-shaped notch has an edge extending slightly oblique to the Y-direction, which forms an X-direction movement regulator (length-direction movement regulator) 820 for regulating movement of the lock portion 630 in the positive X-direction that exceeds a predetermined amount by stopping the abutment portion 640 in the X-direction when the abutment portion 640 is to move in the negative Y-direction and also in the positive X-direction in a state in which the ejection bar 300 is located at the holding position. In the present embodiment, the edge serving as the X-direction movement regulator 820 and the edge serving as the Y-direction movement regulator 810 form an angle that is slightly smaller than 90 degrees. Thus, the abutment portion 640 can reliably be stopped in the X-direction.

As described above, the Y-direction movement regulator 810 and the X-direction movement regulator 820 are formed in the stopper 800 as part of the cover 130. Therefore, the Y-direction movement regulator 810 and the X-direction movement regulator 820 are substantially fixed on the XY-plane with respect to the housing 120 and the cover 130 unlike the ejection bar 300 and the lock member 600.

Figure 13:
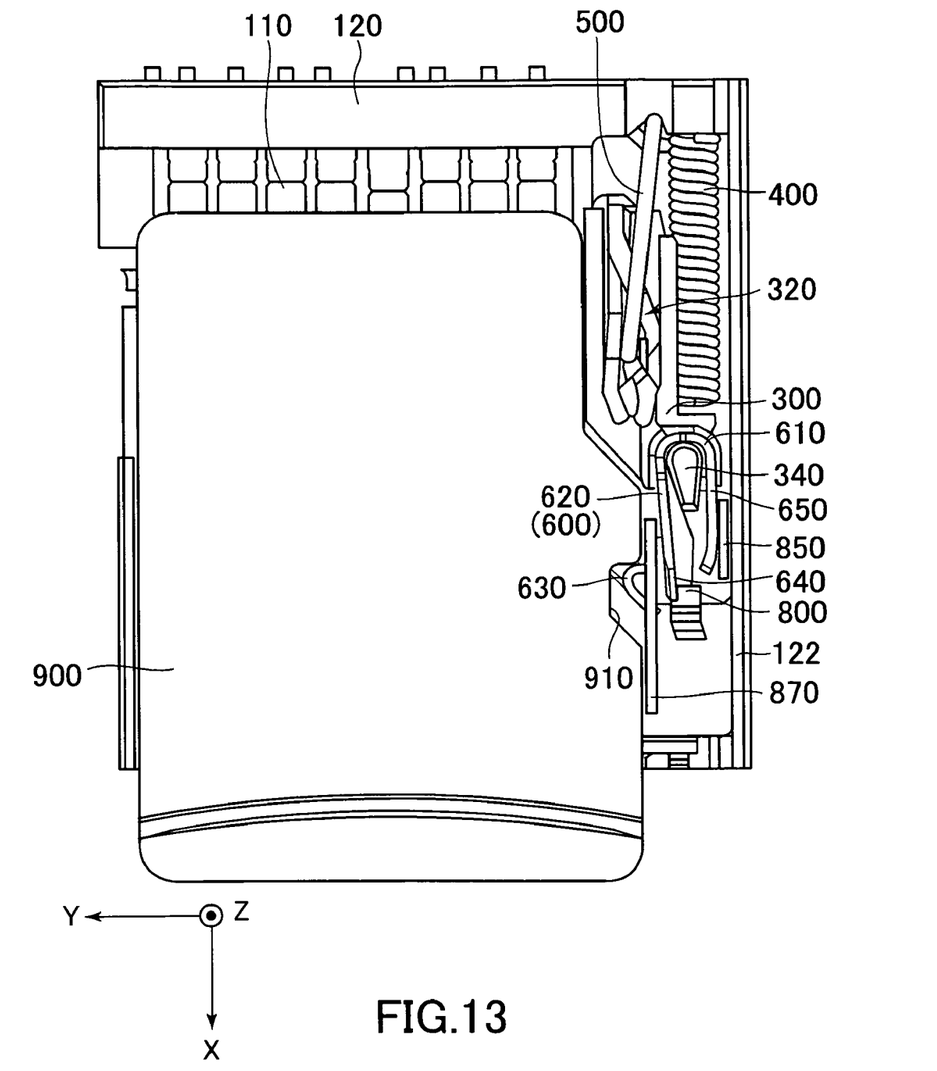
FIG. 13 is a plan view showing the connector when a card is to be drawn forcibly in the holding state, in which only part of the cover is illustrated.
Figure 14:
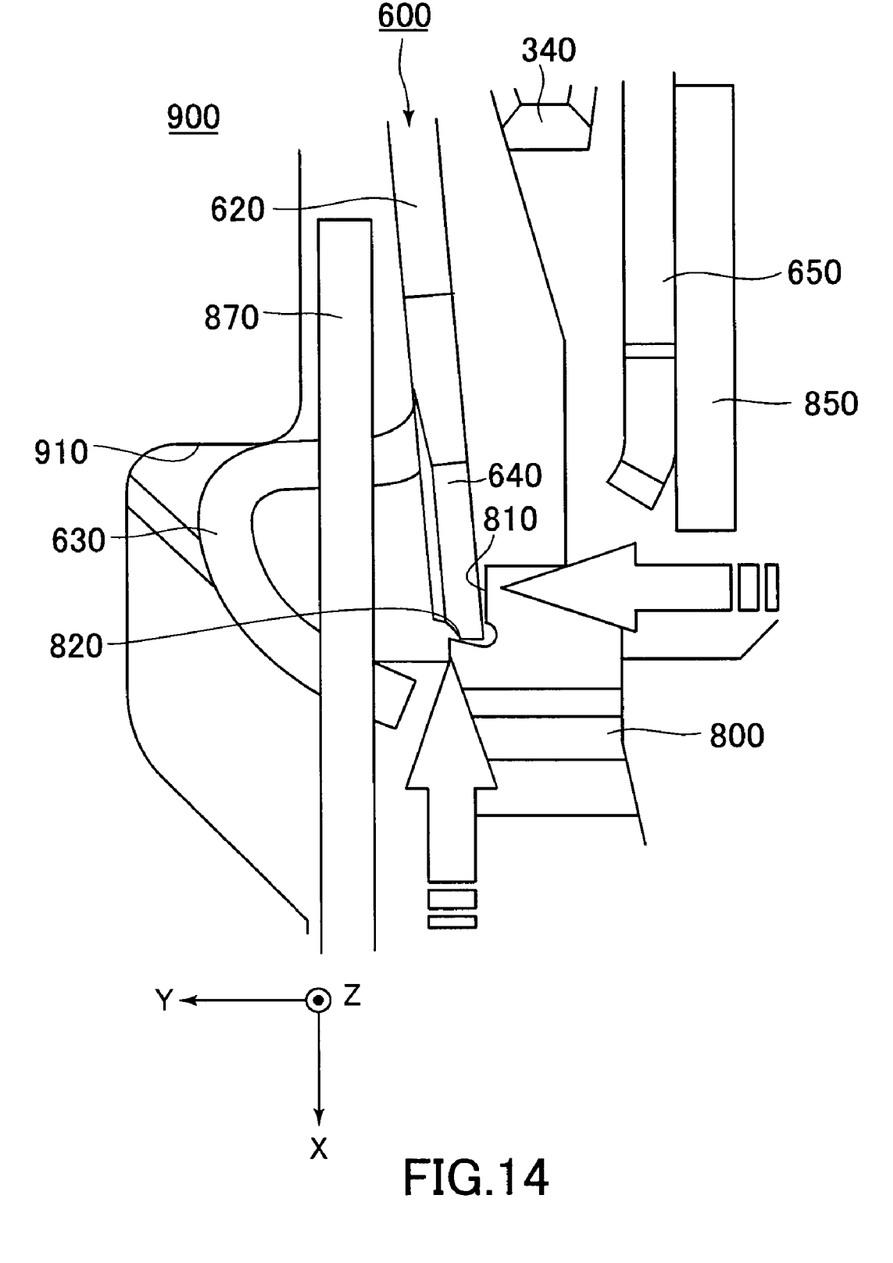
FIG. 14 is an enlarged plan view showing the lock portion and its vicinity in the connector of FIG. 13.

Specifically, as shown in FIGS. 7, 11, and 12, the Y-direction movement regulator 810 is located farther away from the card 900 (i.e., the cavity 200) in the Y-direction than the abutment portion 640 when the ejection bar 300 is located at the holding position. The X-direction movement regulator 820 is located closer to the opening 250 in the X-direction than the abutment portion 640 when the ejection bar 300 is located at the holding position. If the card 900 is to be drawn forcibly in the holding state, the lock portion 630 tends to be pushed out of the notch 910 of the card 900. At that time, as shown in FIGS. 13 and 14, the abutment portion 640 abuts the Y-direction movement regulator 810, so that further movement in the Y-direction is prevented. Therefore, the lock portion 630 is prevented from coming out of the notch 910. In other words, according to the present embodiment, the reliability of locking in the holding state of the card 900 is enhanced as compared to a case where only a spring force of the lock member 600 is used for locking. Additionally, if the card 900 is to be further drawn forcibly in a state in which the abutment portion 640 abuts the Y-direction movement regulator 810, a force used to forcibly draw the card 900 is applied only to the cam follower 500 in a case where there is no X-direction movement regulator 820. Therefore, the cam follower 500 may be stretched (or broken). However, according to the present embodiment, as shown in FIGS. 13 and 14, the abutment portion 640 abuts the X-direction movement regulator 820 to prevent forcible drawing of the card 900. Accordingly, there is no problem that the cam follower 500 may be broken.

Furthermore, the stopper 800 of the present embodiment should not interfere with the lock member 600, which moves together with the ejection bar 300, when the ejection bar 300 moves from the holding position to the ejecting position. In the present embodiment, therefore, the stopper 800 is provided so as to form a clearance C between the stopper 800 and the abutment portion 640 as shown in FIG. 7 when the ejection bar 300 is located at the ejecting position. In view of the size of the connector 100 in the Y-direction, it is difficult to increase the clearance C. In the present embodiment, however, the lock portion 630 is continuously biased toward the cavity 200 by the auxiliary spring portion 650 as described above. Therefore, even if the clearance C is small, the lock member 600 can reliably be prevented from interfering with the stopper 800 when the ejection bar 300 moves from the holding position to the ejecting position.

Additionally, as described above in the present embodiment, the end of the holder 340 near the opening 250 is configured such that its height is gradually increased toward the far side of the connector as viewed from the opening 250. Therefore, when the ejection bar 300 moves from the holding position to the ejecting position, the holder 340 is guided by a lower portion of the stopper 800. As a result, the stopper 800 and the holder 340 can be seen along the Z-direction as partially overlapping each other when the ejection bar 300 is located at the ejecting position (see FIG. 9).

As described above, the Y-direction movement regulator 810 and the X-direction movement regulator 820 of the present embodiment are formed as part of the stopper 800. In other words, the Y-direction movement regulator 810 and the X-direction movement regulator 820 of the present embodiment are formed integrally with each other. Furthermore, in the present embodiment, movement of the ejection bar 300 in the X-direction is regulated indirectly by regulating movement of the lock portion 630 in the X-direction when the ejection bar 300 is located at the holding position. However, the present invention is not limited to this example. For example, the Y-direction movement regulator 810 and the X-direction movement regulator 820 may be provided separately from each other. Furthermore, the X-direction movement regulator 820 may be configured so as to directly regulate movement of the ejection bar 300 in the X-direction. Moreover, while the stopper 800 of the present embodiment is formed as part of the cover 130, it may be formed as part of housing 120 or may be formed by a part provided separately from the cover 130 and the housing 120. When the stopper 800 is formed by a part provided separately from the cover 130 and the housing 120, it is preferable to fix the part to the cover 130 or the housing 120.

Figure 15:
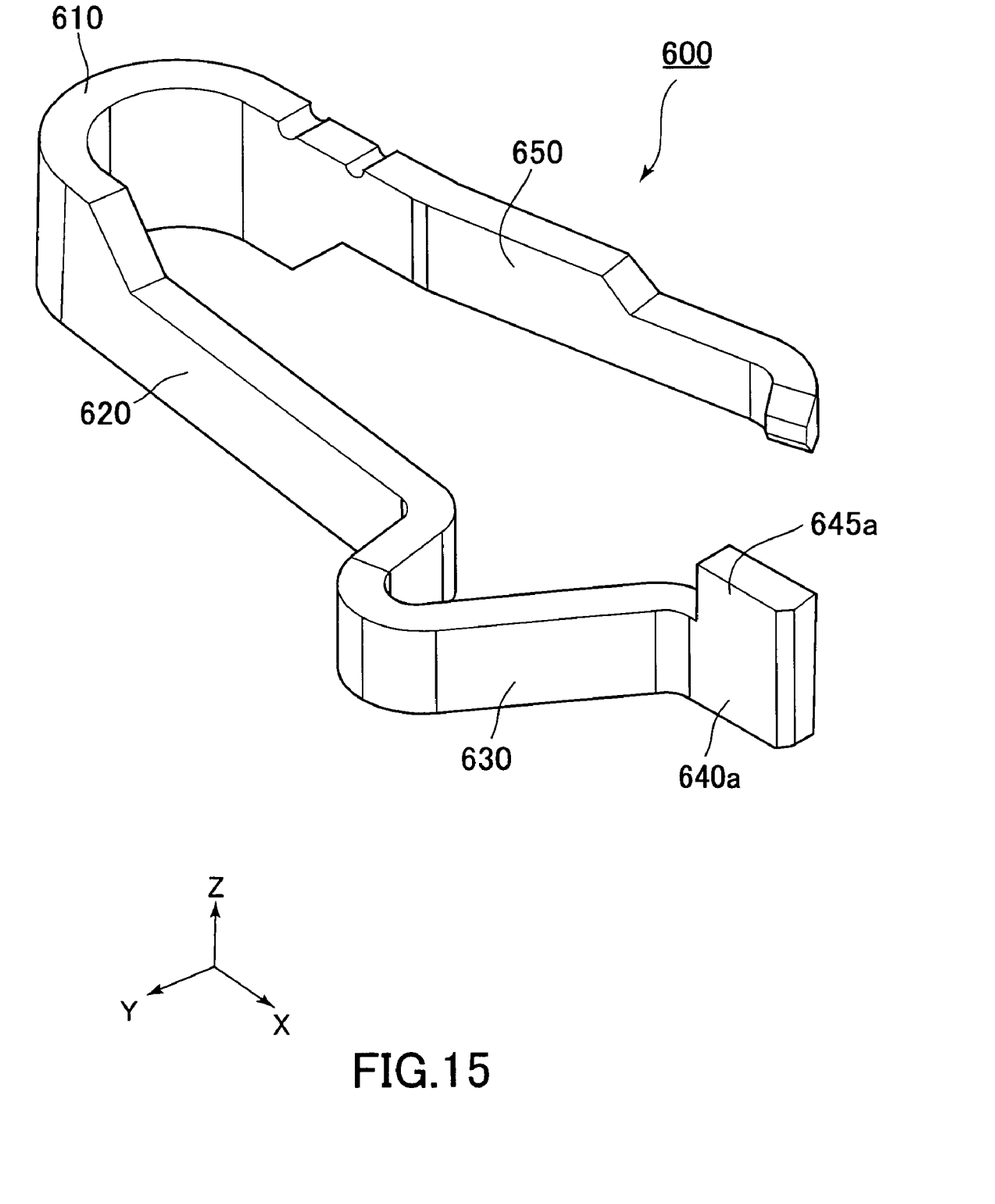
FIG. 15 is a view showing a variation of the lock member shown in FIG. 6.

The shape of the lock member 600 is not limited to that of the present embodiment. For example, the lock member 600 may have no auxiliary spring portion 650. In such a case, it is preferable for the holder 340 of the ejection bar 300 to hold the base 610 firmly (i.e., without any play). Furthermore, while the abutment portion 640 extends along the X-direction from the end of the primary spring portion 620 in the aforementioned embodiment, for example, an abutment portion 640a with a Y-direction abutment portion (width-direction abutment portion) 645a may extend along the X-direction from an end of the lock portion 630 as shown in FIG. 15.

Furthermore, while the stopper 800 has a roughly L-shape in the above embodiment, for example, it may have a roughly J-shape or a roughly U-shape. In those cases, the size of the stopper 800 is slightly increased in the Y-direction.

Moreover, while the lock member 600 is formed by a part separate from the ejection bar 300 in the above embodiment, a portion that has an equivalent function to the lock portion 630 may be provided on part of the ejection bar 300.

According to the present invention, since a width-direction movement regulator is provided for regulating movement of the lock portion in a width direction (a direction perpendicular to a direction in which a card is inserted or drawn) when a movable unit is located at a holding position, the reliability of locking by the lock portion can be enhanced.

Moreover, when a length-direction movement regulator is further provided for regulating movement of the lock portion in a length direction (the direction in which the card is inserted or drawn) when the movable unit is located at the holding position, an excessive load can be prevented from being applied to a cam follower included in an ejection mechanism.

The present invention also provides a connector in which the connector or the housing has a reaction amplifier for amplifying a reaction force applied to the auxiliary spring portion, the reaction amplifier being configured so that the auxiliary spring portion is located between the lock portion and the reaction amplifier in the width direction and held in contact with the reaction amplifier in the width direction when the movable unit is located at the holding position.

Furthermore, the present invention provides a connector in which the reaction amplifier extends as part of the cover toward the housing.

Moreover, the present invention provides a connector in which the lock member has a width-direction abutment portion and which further comprises a lock portion positioner located closer to the cavity than the width-direction abutment portion when the movable unit is located at the holding position, for thereby positioning the biased lock portion in the width direction.

Furthermore, the present invention provides a connector in which the lock portion positioner is formed as part of the cover so as to extend toward the housing.

Moreover, the present invention provides a connector in which the width-direction abutment portion is provided at a different position from that of the lock portion in a thickness direction perpendicular to the length direction and the width direction.

Furthermore, the present invention provides a connector in which the length-direction movement regulator and the width-direction movement regulator are formed as part of the cover or the housing.

Moreover, the present invention provides a connector in which the holder is configured so that the height of the holder is increased from the opening toward a far side of the connector, so that the length-direction movement regulator and the width-direction movement regulator and the holder overlap each other at least in part as viewed along a thickness direction perpendicular to the length direction and the width direction when the movable unit is located at the ejecting position.

Furthermore, the present invention provides a connector in which the width-direction movement regulator is located farther away from the cavity than the abutment portion in the width direction when the movable unit is located at the holding position, and the length-direction movement regulator is located closer to the opening than the abutment portion in the length direction.

Moreover, the present invention provides a connector in which the length-direction movement regulator and the width-direction movement regulator form a roughly L-shape as viewed along a thickness direction perpendicular to the length direction and the width direction.

The present application is based on a Japanese patent application of JP2008-301365 filed before the Japan Patent Office on Nov. 26, 2008, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector comprising:

an ejection mechanism operable to eject a card having a notch along a length direction, the ejection mechanism including a movable unit that is movable between a holding position, at which the movable unit is located when the card has been inserted in the connector, and an ejecting position, at which the movable unit is located when the card has been ejected from the connector, along the length direction during insertion and ejection of the card, the movable unit including an ejection bar movable along the length direction and a lock member comprising a lock portion and an abutment portion movable along with the lock portion, the ejection bar having a holder configured to hold the lock member, the lock portion being movable, when the movable unit moves along the length direction, along the length direction and a width direction perpendicular to the length direction, the lock portion being located within the notch of the card to prevent ejection of the card when the movable unit is located at the holding position;

at least one contact;

a housing for holding the at least one contact;

a cover for covering the housing, the cover and the housing defining a cavity and an opening, the cavity being able to receive at least part of the card, the opening allowing the card to be inserted into the cavity therethrough;

a width-direction movement regulator configured to stop the abutment portion from moving along the width direction when the movable unit is located at the holding position to thereby regulate the movement of the lock portion in the width direction and to prevent the lock portion from moving in the width direction when the movable unit is located at the holding position; and a length-direction movement regulator configured to stop the abutment portion from moving along the length direction when the movable unit is located at the holding position to thereby regulate the movement of the lock member in the length direction and to prevent the movable unit from moving in the length direction when the movable unit is located at the holding position.

2. The connector as recited in claim 1, wherein
the length-direction movement regulator and the width-direction movement regulator are fixed on a plane defined by the length direction and the width direction with respect to the housing and the cover.

3. The connector as recited in claim 1, wherein
the length-direction movement regulator and the width-direction movement regulator are formed integrally with each other.

4. The connector as recited in claim 3, wherein
the length-direction movement regulator is configured to regulate movement of the lock portion along the length direction for thereby preventing the movement of the movable unit along the length direction.

5. The connector as recited in claim 1, wherein
the length-direction movement regulator and the abutment portion are arranged so as to form a clearance between the length-direction movement regulator and the abutment portion at least in the width direction when the movable unit is located the holding position.

6. The connector as recited in claim 1, wherein
the lock member includes a base configured to be held by the holder and a primary spring portion extending from the base to the lock portion.

7. The connector as recited in claim 6, wherein
the abutment portion extends along the length direction from an end of the primary spring portion or an end of the lock portion.

8. The connector as recited in claim 6, wherein
the holder holds the base with a play,
the lock member includes an auxiliary spring portion extending from the base so as to form a roughly U-shape together with the base and the spring portion, and
the auxiliary spring portion is configured to abut a predetermined internal portion of the connector, receive a reaction force from the predetermined internal portion, and biases the lock portion toward the notch of the card with the reaction force.

* * * * *